(12) United States Patent
Mouret et al.

(10) Patent No.: US 6,784,651 B2
(45) Date of Patent: Aug. 31, 2004

(54) CURRENT SOURCE ASSEMBLY CONTROLLABLE IN RESPONSE TO A CONTROL VOLTAGE

(75) Inventors: Michel Mouret, Jarrie (FR); Marc Sabut, Eybens (FR); François Van Zanten, Meylan (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/257,232
(22) PCT Filed: Nov. 29, 2001
(86) PCT No.: PCT/FR01/03788
§ 371 (c)(1), (2), (4) Date: Feb. 10, 2003
(87) PCT Pub. No.: WO02/45261
PCT Pub. Date: Jun. 6, 2002

(65) Prior Publication Data
US 2003/0160599 A1 Aug. 28, 2003

(51) Int. Cl.[7] .............................. G05F 3/16; G05F 3/20
(52) U.S. Cl. ........................ 323/315; 323/316; 323/314
(58) Field of Search ................................. 323/315, 316, 323/314, 313

(56) References Cited

U.S. PATENT DOCUMENTS

| 5,077,541 A | * 12/1991 | Gilbert ........................ 330/284 |
| 5,977,817 A | * 11/1999 | de la Soujeole ............. 327/538 |
| 6,236,238 B1 | * 5/2001 | Tanji et al. .................... 326/83 |
| 6,448,811 B1 | * 9/2002 | Narendra et al. ............. 326/82 |

* cited by examiner

*Primary Examiner*—Bao Q. Vu
(74) *Attorney, Agent, or Firm*—Lisa K. Jorgenson; Harold H. Bennett, II; Seed IP Law Group PLLC

(57) ABSTRACT

A controllable assembly of current sources includes several first output terminals, with a first transistor associated with each first output terminal, the current on each first output terminal depending on the current flowing through the first transistor, and a circuit configured, in response to a predetermined variation of a control voltage, to successively progressively turn on, then progressively turn off, each first transistor. The first transistors are MOS transistors, and each first output terminal is associated with a current mirror formed of MOS transistors, the current mirror providing to the first output terminal a current depending on the current flowing through the first transistor.

18 Claims, 4 Drawing Sheets

CURRENT SOURCE ASSEMBLY CONTROLLABLE IN RESPONSE TO A CONTROL VOLTAGE

BACKGROUND OF THE INVENTION

1. Technical Field

The present invention relates to a controllable assembly of current sources, and in particular to such a controllable current source assembly controlling an amplifier having a gain varying exponentially as a response to an analog control voltage.

Such an amplifier may be formed as an integrated circuit and is for example used as a gain scan amplifier in a mobile telephony equipment.

2. Description of the Related Art

FIG. 1 schematically shows a conventional amplifier, the gain of which exponentially varies as a response to an analog control voltage. Such an amplifier is described in patent U.S. Pat. No. 5,077,541. The amplifier includes an input terminal E receiving a variable positive input voltage Vin. The amplifier further includes two control terminals A and B receiving a control voltage VAB, and an output terminal generating an output voltage Vout. The amplifier includes an attenuator block 2. Attenuator block 2 has an input terminal connected to terminal E, and n output terminals Oi (i ranging between 1 and n). Each output terminal Oi of block 2 generates a control voltage equal to input voltage Vin attenuated according to a predetermined ratio, for example $2^i$ in the case of an R/2R attenuator. Each output terminal Oi of block 2 is associated with a transconductance element $g_m i$ controllable by a current. Each transconductance element $g_m i$ receives as an input the voltage generated by the terminal Oi of same rank i. An output block 4, connected to a supply voltage VDD, generates voltage Vout as a response to the sum of the currents provided by transconductance elements $g_m i$. Output block 4 is also connected to provide a feedback signal to transconductance elements $g_m i$. A controllable set of current sources 6 includes outputs Si, each output Si being connected to control the transconductances of the transconductance element $g_m i$ of same rank i. Control terminals A and B are connected to controllable current source assembly 6.

FIG. 2 schematically shows a conventional controllable current source assembly 6, also described in patent U.S. Pat. No. 5,077,541. Each output terminal Si is connected to the collector of an NPN-type bipolar transistor T1i. The emitters of transistors T1i are interconnected and connected to ground (GND) via a constant current source CS1. The base of each transistor T1i is connected to a node Ni of a control means 8. In control means 8:

the first node N1 is coupled to terminal A;
the last node Nn is coupled to terminal B;
each node Nj (j ranging between 1 and n−1) is connected to node Nj+1 via a resistor 10; and
each node Nj (j ranging between 2 and n−1) is connected to a first terminal of a constant current source 12 specific to this node.

FIG. 3 illustrates in a simplified manner the variation of the gain of the amplifier of FIG. 1 when the successive transconductance elements $g_m i$ are activated. In the example shown, it is assumed that n=6. If each of transconductance elements $g_m 6$ to $g_m 1$ is successively and separately activated, output block 4 receives a current successively proportional to an attenuation of ratio $2^6$, $2^5$, $2^4$, $2^3$, $2^2$, and $2^1$ of voltage Vin. The amplifier gain thus varies exponentially. The all-or-nothing activation of transconductance elements $g_m i$ causes abrupt variations of the gain, according to a stepped curve such as the curve shown in full line. Current source assembly 6 is provided to suppress these abrupt gain variations and provide the gain variation illustrated in dotted lines in FIG. 3.

FIG. 4 schematically illustrates the control currents Ii respectively generated by output terminals Si of current source assembly 6. Control means 8 is provided, when control voltage VAB describes a predetermined voltage range, for successively progressively turning on each transistor T1i, then progressively turning it off, while having the sum of the currents Ii running through all transistors T1i remain substantially constant. It is considered hereafter that control means 8 is provided so that at most two transistors T1i are on at the same time. It is assumed that the preceding predetermined voltage range is included between a minimum voltage−Vmax (VA=0 and VB=Vmax), and a maximum voltage+Vmax (VA=Vmax and VB=0). When voltage VAB is minimum, the voltages of nodes Ni are such that only transistor T16 is on. Transistor T16 is then run through by a maximum current of value Imax. When voltage VAB linearly increases, the voltage of nodes N6, N5 varies so that transistor T16 is progressively turned off while transistor T15 is progressively turned on. The other transistors T1i are off. When transistor T15 is completely on, it is run through by a maximum current of value Imax and transistor T16 is off. When voltage VAB keeps on increasing until value+Vmax, transistor T15 is progressively turned off while transistor T14 is progressively turned on, and so on until transistor T11 is on and run through by current Imax.

However, current sources 12 of control means 8 permanently provide a current in the bases of transistors T1i of current source assembly 6. The existence of these base currents makes the forming of control means 8 difficult, especially for the determination of resistances 10 and of the values of current sources 12. Further, these base currents especially depend on the manufacturing process and on the operating temperature. This results in that a same control voltage VAB will not have the same effect upon current sources 6 for two different operating temperatures.

A completely differential variable-gain amplifier receiving a differential input signal and generating a differential output signal is conventionally formed by means of two identical amplifiers. A first amplifier receives a voltage Vin and generates as a response a voltage Vout, and the second amplifier receives a voltage Vin' and generates as a response a voltage Vout'. The two amplifiers must be identical so that the output signal is not distorted. It is in particular important that the current sources 6 controlling each amplifier be identical and generate identical control currents for a same control voltage VAB. Now, it is difficult to form two matched current sources 6. In particular, when the amplifier is formed as an integrated circuit, the two sets of transistors T1i may be remote from each other, and it is difficult to form two sets of transistors T1i having the same properties.

Further, the structure of current source assembly 6 is such that its output terminals Si inevitably have a high operating voltage (for example, greater than 2.2 V), due, in particular, to the fact that a high operating voltage (2.5 V) must be provided on control nodes A and B of means 8. This constraint and the existence of the other circuits constitutive of the amplifier of FIG. 1 results in that such an amplifier must be supplied under a high voltage, generally 5 V. Many electronic devices have a supply voltage smaller than 3 V, especially mobile telephony equipment, and it is desirable to have a variable-gain amplifier which can be supplied by a voltage smaller than 3 V.

SUMMARY OF THE INVENTION

An object of the present invention is to provide a variable-gain amplifier having the same functions as the amplifier of FIG. 1 and that can be supplied by a voltage lower than 3 V.

Another object of the present invention is to provide such a current source assembly including a control means which is easy to form.

Another object of the present invention is to provide such a current source assembly, having a response to temperature which does not depend on temperature.

Another object of the present invention is to provide such a current source assembly which can provide matched control current pairs.

To achieve these objects, the present invention provides a controllable assembly of current sources including several first output terminals, a first transistor associated with each first output terminal, the current on each first output terminal depending on the current flowing through the first transistor, and a control means provided for, as a response to a predetermined variation of a control voltage, successively progressively turning on, then progressively turning off, each first transistor, in which the first transistors are MOS transistors, and in which each first output terminal is associated with a current mirror formed of MOS transistors, said current mirror providing to the first output terminal a current depending on the current flowing through the first transistor.

According to an embodiment of the present invention, the current mirror associated with each first output terminal includes a second transistor connected in series with the first transistor associated with the first output terminal, and a third transistor connected as a current mirror with the second transistor, the third transistor being also connected so that the current provided by the first output terminal is equal to the current flowing through the third transistor.

According to an embodiment of the present invention, the first transistor is a P-channel transistor having its source connected to a first supply voltage via a constant current source and having its gate connected to a node of the control means, the second transistor is an N-channel transistor having its source connected to a second supply voltage, having its gate connected to the drain, and having its drain connected to the drain of the first transistor, the third transistor is an N-channel transistor having its source connected to the second supply voltage, having its gate connected to the gate of the second transistor and having its drain connected to the first output terminal.

According to an embodiment of the present invention, the current source assembly includes for each of the current mirrors a fourth transistor identical to the third transistor, also connected as a current mirror with the second transistor, and a second output terminal coupled to the fourth transistor so that the second output terminal generates a current equal to the current running through the fourth transistor.

The present invention also aims at a variable-gain amplifier including an attenuator block having an input terminal receiving an input voltage and having several output terminals, several transconductance elements controllable by a current, each transconductance element having an input connected to an output terminal of the attenuator block, a current source assembly such as previously described, each first output terminal of the current source assembly being connected to provide a control current to a transconductance element, and an output block providing an output voltage as a response to the sum of the currents provided by the transconductance elements.

According to an embodiment of the present invention, the variable-gain amplifier includes a differential attenuator block having an input receiving a differential input signal and having several differential output terminals, several pairs of transconductance elements controllable by a current, each pair of transconductance elements having a differential input connected to a differential output terminal of the attenuator block, each pair of transconductance elements generating a current pair, an assembly of current sources such as previously described, having their first and second output terminals connected to, each, control a pair of transconductance elements, and an output block providing a differential output signal as a response to the sum of the current pairs provided by the pairs of transconductance elements.

The foregoing objects, features and advantages of the present invention will be discussed in detail in the following non-limiting description of specific embodiments, in conjunction with the accompanying drawings.

DETAILED DESCRIPTION OF THE INVENTION

Same references represent same elements in the different drawings. Only those elements necessary to the understanding of the present invention have been shown in the following drawings.

Figure 2:
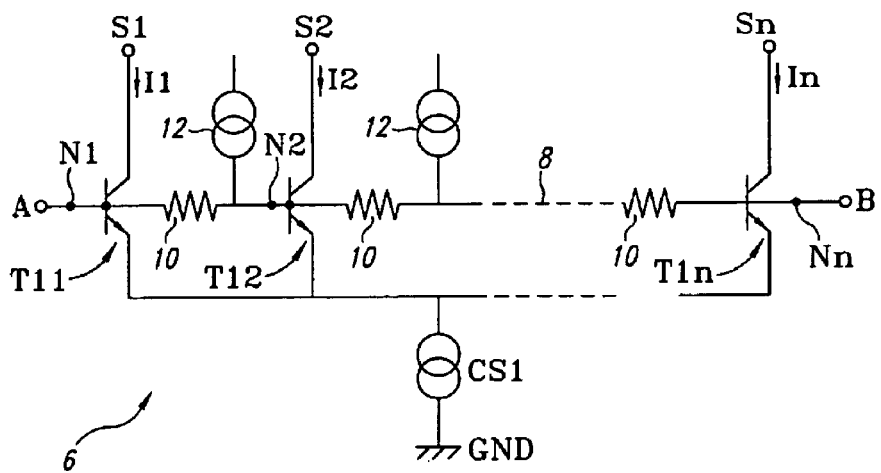
FIG. 2, previously described, schematically shows a conventional controllable current source assembly.
Figure 3:
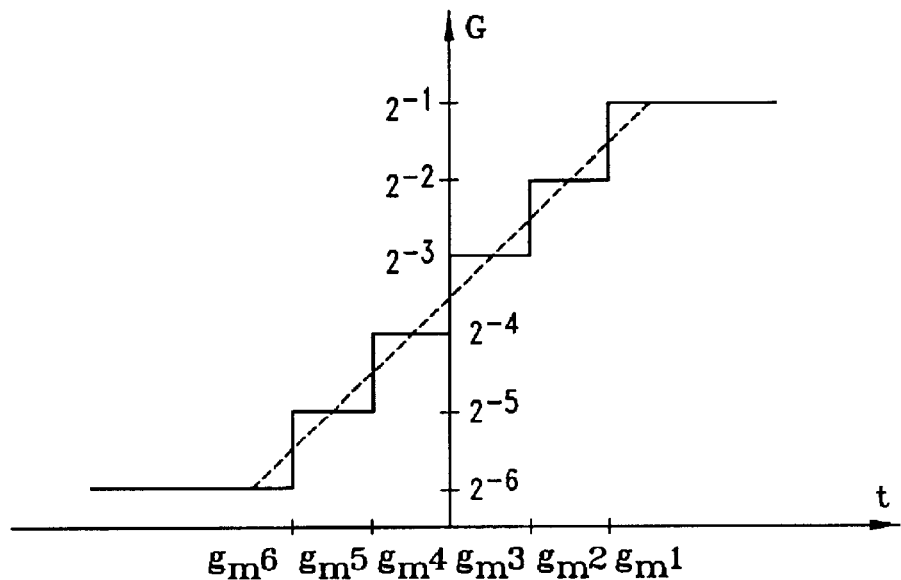
FIG. 3, previously described, illustrates the operation of the amplifier of FIG. 1.
Figure 5:
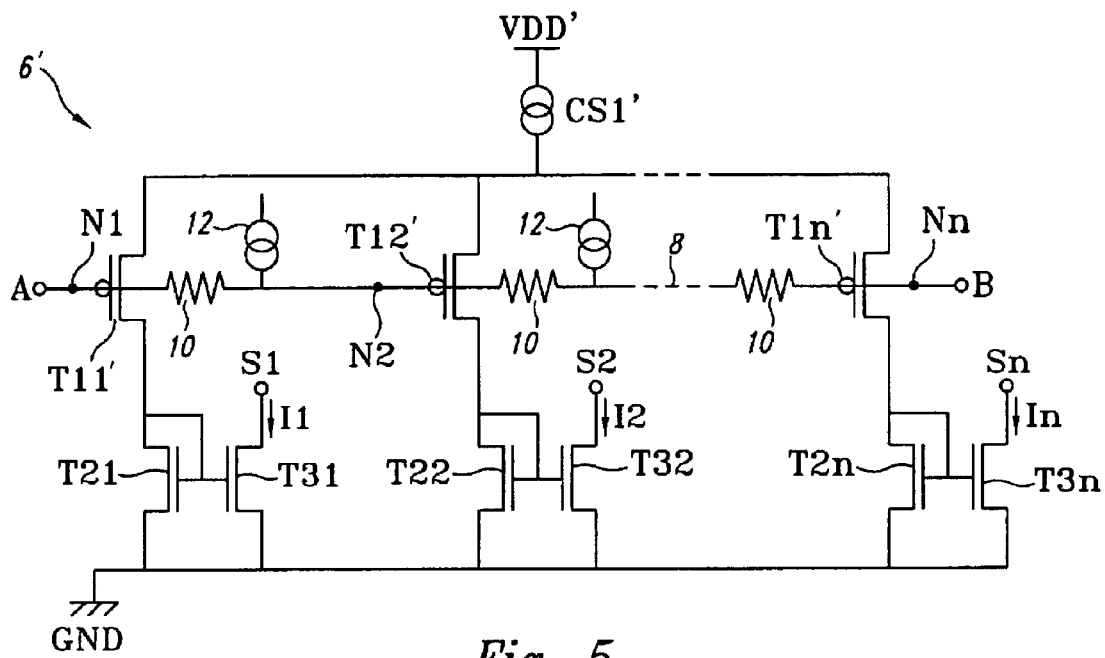
FIG. 5 schematically shows a controllable current source assembly according to a first embodiment of the present invention.

FIG. 5 schematically shows a controllable current source assembly 6' according to the present invention. Current source assembly 6' includes n output terminals Si (i ranging between 1 and n) and two control terminals A and B. Each output terminal Si is connected to the drain of an N-channel MOS transistor T3i. The source of each transistor T3i is connected to ground (GND). Each transistor T3i is associated with an N-channel MOS transistor T2i and with a P-channel MOS transistor T1i'. The source of transistor T2i is connected to ground. The gate and the drain of transistor T2i are interconnected. The gate of transistor T3i is connected to the gate of transistor T2i, so that the current flowing through transistor T3i depends on the current flowing through transistor T2i. The drain of transistor T2i is connected to the drain of transistor T1i', so that these transistors are in series. The source of transistor T1i' is connected to a supply voltage VDD' via a constant current source CS1'. The gate of transistor T1i' is connected to a node Ni of a control means 8 of same structure as the control means 8 described in relation with FIG. 2.

Figure 1:
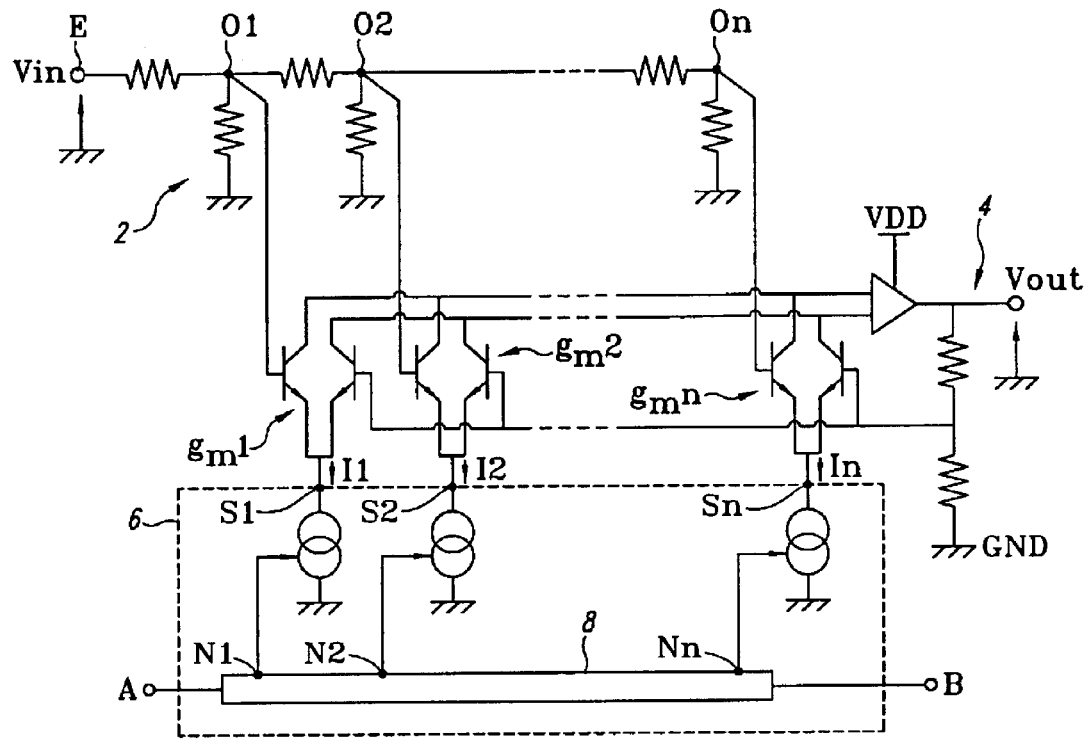
FIG. 1, previously described, schematically shows a conventional variable-gain amplifier.
Figure 4:
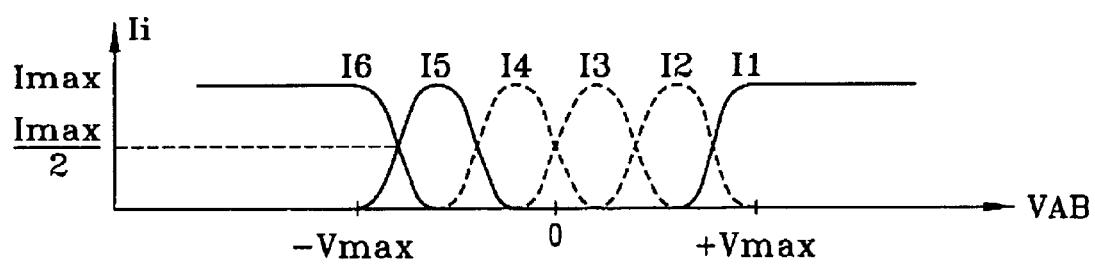
FIG. 4, previously described, illustrates the operation of the current source assembly of FIG. 2.

Each output terminal Si provides a current Ii depending on the current flowing through transistor T1i', that is, depending on the voltage of the node Ni of same rank i. Control means 8 has an operation similar to the operation described in relation with FIG. 4. When voltage VAB is in a predetermined voltage range, control means 8 successively progressively turns on, then progressively turns off, each transistor T1i', so that the sum of the currents Ii running through transistors T1i' is substantially constant. The function of current source assembly 6' thus is the same as that of prior current source assembly 6. The operating voltage of each output terminal Si is only determined by the drain-source voltage of transistor T3i, when said transistor is on, that is, substantially 0.2 V, and is independent from the control voltage on nodes A, B of means 8. Such an operating voltage enables efficient control of transconductance elements $g_m i$ of the amplifier of FIG. 1 even if said amplifier is supplied under 3 V.

Further, current sources 12 of control means 8 provide no current to the gates of transistors T3i', which greatly simplifies the design of control means 8 and suppresses temperature dependence problems.

Figure 6:
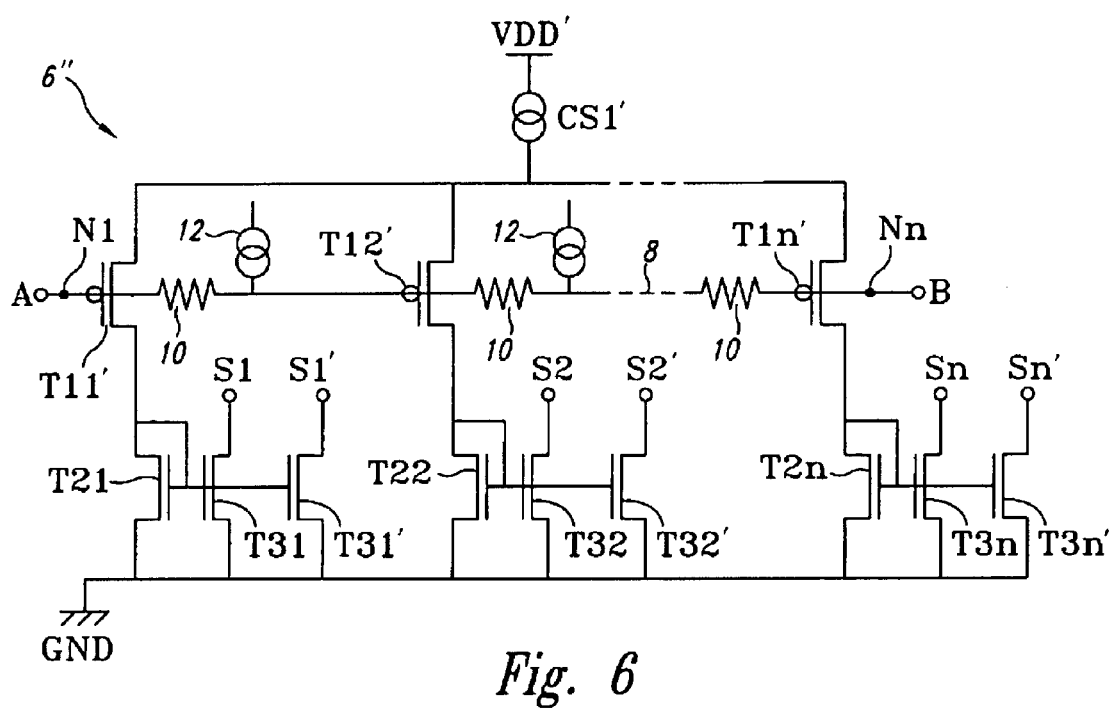
FIG. 6 schematically shows a controllable current source assembly according to a second embodiment of the present invention.

FIG. 6 schematically shows a current source assembly 6" according to a second embodiment of the present invention. Each transistor T2i, instead of being assembled as a current mirror with a transistor T3i, is associated with two identical duplicating transistors T3i and T3i', respectively connected to output terminals Si and Si'. Arranging transistors T3i and T3i' close to each other in an integrated circuit is a simple task. It is then simple to form matched transistors T3i and T3i'. This enables simple forming of a completely differential amplifier such as illustrated as an example in FIG. 7.

Figure 7:
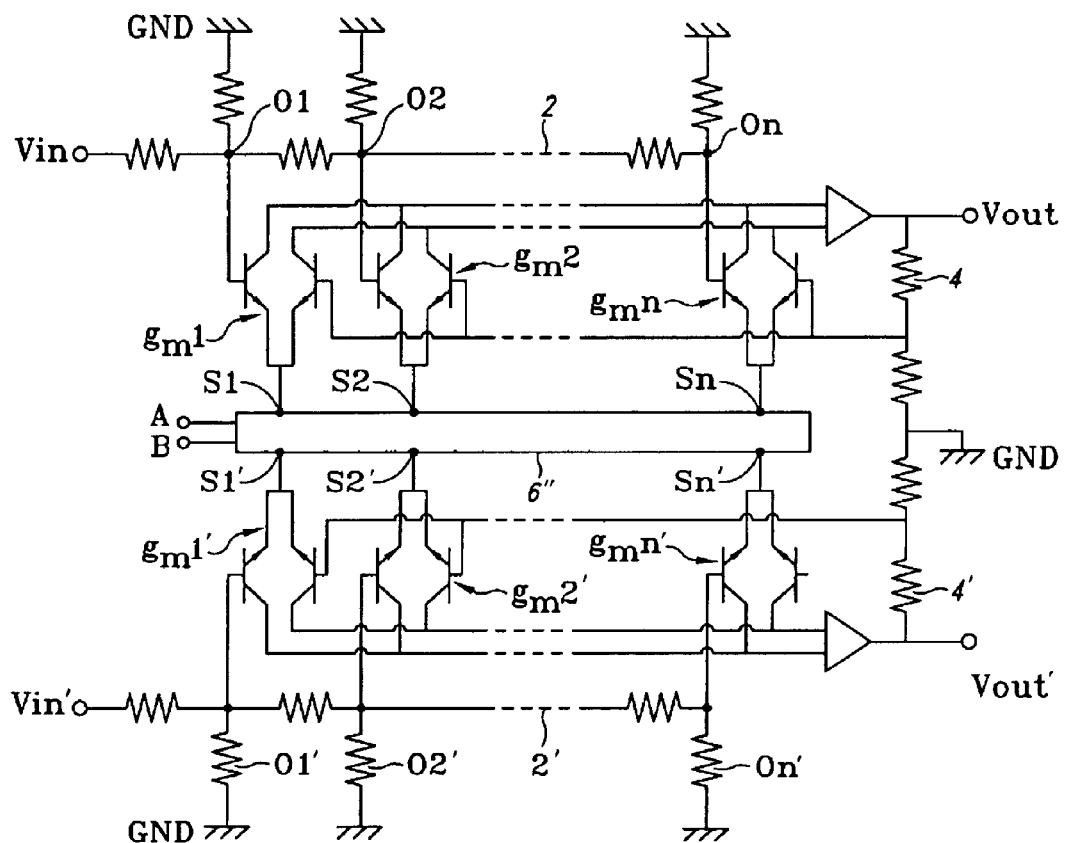
FIG. 7 shows a variable-gain amplifier using the current source assembly of FIG. 6.

FIG. 7 schematically shows a variable-gain amplifier intended for receiving a differential voltage Vin–Vin' and for providing as a response a differential voltage Vout–Vout', including an amplifier 6" such as described in relation with FIG. 6. Voltage Vin is provided to an attenuator block 2 controlling transconductance elements $g_m i$. Each transconductance element $g_m i$ is current-controlled by the output Si of same rank i of current source assembly 6". The currents generated by transconductance elements $g_m i$ are provided to an output block 4, which provides voltage Vout as a response. Output block 4 provides a feedback signal to transconductance elements $g_m i$. Voltage Vin' is provided to an attenuator block 2' identical to block 2. Block 2' controls transconductance elements $g_m i'$, each transconductance element $g_m i'$ being identical to the transconductance element $g_m i$ of same rank i. Each transconductance element $g_m i'$ is current-controlled by the output Si' of same rank i of current source assembly 6". The currents generated by transconductance elements $g_m i'$ are provided to an output block 4', identical to block 4, which provides voltage Vout' as a response. Output block 4' provides a feedback signal to transconductance elements $g_m i'$.

Attenuator blocks 2 and 2' form a differential attenuator block receiving the differential input signal Vin–Vin', each pair Oi, Oi' forming a differential output terminal of the differential output block. Each differential output terminal Oi, Oi' of the differential attenuator block controls a pair of transconductance elements $g_m i$, $g_m i'$. Output blocks 4 and 4' form a differential output block receiving the current provided by the pairs of transconductance elements $g_m i$, $g_m i'$, and generating differential output signal Vout–Vout' as a response. The pairs of transconductance elements $g_m i$, $g_m i'$ are controlled by the pairs of matched control currents Ii, Ii' generated by current source assembly 6".

The present invention is likely to have various alterations, modifications, and improvements which will readily occur to those skilled in the art. In particular, transistors T1i' have been described as P-channel MOS transistors, but those skilled in the art will easily adapt the present invention to N-channel MOS transistors T1i'.

Further, the current source assembly according to the present invention has been described in relation with a specific control means 8, controlling the current source assembly so that the sum of the currents provided by the current source assembly is substantially constant, and that at most two transistors T1i are on at the same time, but those skilled in the art will easily adapt the present invention to a different control means 8, for example, such that more than two transistors T1i are on at the same time.

Further, the current source assembly according to the present invention has been described in relation with the control of a specific variable-gain amplifier, but those skilled in the art will easily adapt the present invention to the control of another type of amplifier, or to any other application requiring use of such a current source assembly, for example, an electric potentiometer.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A controllable assembly of current sources comprising:
    several first output terminals;
    a plurality of first transistors associated respectively with first output terminal, the current on each first output terminal depending on the current flowing through the associated first transistor, wherein the first transistors are MOS transistors;
    a control means provided for, as a response to a predetermined variation of a control voltage, successively progressively turning off each first transistor while progressively turning on each next first transistor, until a last one of the first transistors is turned on; and
    a plurality of current mirrors, formed of MOS transistors, associated respectively with the first output terminals, each current mirror providing to the associated first output terminal a current depending on the current flowing through the associated first transistor.

2. The current source assembly of claim 1 wherein the current mirror associated with each first output terminal includes:
    a second transistor connected in series with the first transistor associated with the first output terminal; and
    a third transistor connected as a current mirror with the second transistor, the third transistor being also connected so that the current provided by the first output terminal is equal to the current flowing through the third transistor.

3. The current source assembly of claim 2 wherein:
    the first transistor is a P-channel transistor having its source connected to a first supply voltagevia a constant current source and having its gate connected to a node of the control means;
    the second transistor is an N-channel transistor having its source connected to a second supply voltage, having its gate and drain interconnected, and having its drain connected to the drain of the first transistor; and the third transistor is an N-channel transistor having its source connected to the second supply voltage, having its gate connected to the gate of the second transistor and having its drain connected to the first output terminal.

4. The current source assembly of claim 2, including for each current mirror a fourth transistor identical to the third transistor, also connected as a current mirror with the second transistor, and including a second output terminal coupled to the fourth transistor so that the second output terminal generates a current equal to the current running through the fourth transistor.

5. A variable-gain amplifier comprising:

an attenuator block having an input terminal receiving an input voltage and having several output terminals;

several transconductance elements controllable by a current, each transconductance element having an input connected to an output terminal of the attenuator block;

an output block providing an output voltage as a response to the sum of the currents provided by the transconductance elements; and a controllable assembly of current sources, including:

several first output terminals;

a first transistor associated with each first output terminal, the current on each first output terminal depending on the current flowing through the first transistor, wherein the first transistors are MOS transistors;

a second transistor associated with each first output terminal, connected in series with the first transistor associated with the first output terminal;

a third transistor associated with each first output terminal, connected as a current mirror with the second transistor, the third transistor being also connected so that the current provided by the first output terminal is equal to the current flowing through the third transistor; and a control means provided for, as a response to a predetermined variation of a control voltage, successively progressively turning on, then progressively turning off, each first transistor.

6. A variable-gain amplifier including:

a differential attenuator block having an input receiving a differential input signal and having several differential output terminals;

several pairs of transconductance elements controllable by a current, each pair of transconductance elements having a differential input connected to a differential output terminal of the attenuator block, each pair of transconductance elements generating a current pair;

an output block providing a differential output signal as a response to the sum of the current pairs provided by the pairs of transconductance elements; and a controllable assembly of current sources, including:

several first output terminals;

a first transistor associated with each first output terminal, the current on each first output terminal depending on the current flowing through the first transistor, wherein the first transistors are MOS transistors;

a second transistor associated with each first output terminal, connected in series with the first transistor associated with the first output terminal;

a third transistor associated with each first output terminal, connected as a current mirror with the second transistor, the third transistor being also connected so that the current provided by the first output terminal is equal to the current flowing through the third transistor;

a fourth transistor associated with each first output terminal, identical to the third transistor, also connected as a current mirror with the second transistor, and including a second output terminal coupled to the fourth transistor so that the second output terminal generates a current equal to the current running through the fourth transistor; and a control means provided for, as a response to a predetermined variation of a control voltage, successively progressively turning on, then progressively turning off, each first transistor.

7. A device, comprising:

a first plurality of output terminals;

a control circuit having first and second input terminals and a plurality of switch terminals, each of the switch terminals corresponding to a different segment of a voltage range of voltage, such that when a voltage difference falling within a particular segment of the voltage range is present between the first and second input terminals, the control circuit is configured to present, at the switch terminal corresponding to that segment, a progressive on signal having a value corresponding to the voltage difference, and to present an off signal at switch terminals not corresponding to that segment;

a first plurality of MOS transistors, a first conduction terminal of each transistor being connected to a first common node and a control terminal of each transistor being connected to a respective one of the plurality of switch terminals, each of the first plurality of MOS transistors being configured, when the on signal is present at the respective switch terminal, to progressively switch on to a degree corresponding to the value of the on signal, and to switch off when the off signal is present at the respective switch terminal;

a second plurality of MOS transistors, a first conduction terminal and a control terminal of each of the second plurality of transistors being connected to a second conduction terminal of a respective one of the first plurality of transistors, a second conduction terminal of the second plurality of transistors being connected to a second common node;

a third plurality of MOS transistors, a first conduction terminal of each of the third plurality of transistors being connected to a respective one of the first plurality of output terminals, a second conduction terminal of each of the third plurality of transistors being connected to the second common node, and a control terminal of each of the third plurality of transistors being connected to the control terminal of a respective one of the second plurality of transistors.

8. The device of claim 7, wherein the segments of the voltage range have some overlap such, that switch terminals corresponding to adjacent segments may each have an on signal simultaneously.

9. The device of claim 7, further comprising:

a second plurality of output terminals; and a fourth plurality of MOS transistors, a first conduction terminal of each of the fourth plurality of transistors being connected to a respective one of the second plurality of output terminals, a second conduction terminal of each of the fourth plurality of transistors being connected to the second common node, and a control terminal of each of the fourth plurality of transistors being connected to the control terminal of a respective one of the second plurality of transistors.

10. A device, comprising:
a common current source;
a common ground node;
a first plurality of output terminals;
a control circuit having first and second input terminals and a plurality of switch terminals, each of the switch terminals corresponding to a different segment of a range of voltage, such that when a voltage difference falling within a particular segment of the range of voltage is present between the first and second input terminals the control circuit is configured to present an on signal at the switch terminal corresponding to that segment, and to present an off signal at switch terminals not corresponding to that segment, the on signal being a signal that increases progressively; and
a plurality of current control cells, each cell having:
a first transistor having a control terminal connected to a respective one of the plurality of switch terminals, and first and second conduction terminals, the first conduction terminal being connected to the common current source, the first transistor configured to turn on progressively when the on signal is present at its control terminal and to turn off when the off signal is present at its control terminal;
a second transistor, having a first conduction terminal and a control terminal connected to the second conduction terminal of the first transistor and a second conduction terminal connected to the common ground; and
a third transistor, having a first conduction terminal connected to a respective one of the first plurality of output terminals, a second conduction terminal connected to the common ground and a control terminal connected to the control terminal of the second transistor.

11. A method, comprising:
proaressively switching on one of a plurality of current control circuits when a voltage difference between two reference terminals falls within a range of voltages corresponding to that circuit, where each of the plurality of current control circuits corresponds to different and consecutive ranges;
switching off one of the plurality of current control circuits when the voltage difference no longer falls within the range of voltages corresponding to that circuit; and
wherein each of the current control circuits includes a switching portion, an output terminal and a current mirror configuration, arranged such, that current flowing in the switching portion of the circuit is mirrored in the output terminal.

12. The method of claim 11, wherein each of the plurality of current control circuits further includes a second output terminal, and the circuit is configured to mirror the current flowing in the switching portion in the second output terminal.

13. The current source assembly of claim 1 wherein the control means successively progressively turns off each first transistor while progressively turning on each next first transistor such that the sum of the currents running through the first transistors is substantially constant.

14. The variable-gain amplifier of claim 5 wherein the control means successively progressively turns off each first transistor while progressively turning on each next first transistor such that the sum of the currents running through the first transistors is substantially constant.

15. The variable-gain amplifier of claim 6 wherein the control means successively progressively turns off each first transistor while progressively turning on each next first transistor such that the sum of the currents running through the first transistors is substantially constant.

16. The device of claim 7 wherein the control circuit is structured to successively progressively turn off each first transistor while progressively turning on each next first transistor such that the sum of the currents running through the first transistors is substantially constant.

17. The device of claim 10 wherein the control circuit is structured to successively progressively turn off each first transistor while progressively turning on each next first transistor such that the sum of the currents running through the first transistors is substantially constant.

18. The method of claim 11, further comprising successively progressively turning off each current control circuit while progressively turning on each next current control such that the sum of the currents running through the switching portions of the current control circuits is substantially constant.

* * * * *

UNITED STATES PATENT AND TRADEMARK OFFICE
CERTIFICATE OF CORRECTION

PATENT NO. : 6,784,651 B2
DATED : August 31, 2004
INVENTOR(S) : Michel Mouret et al.

It is certified that error appears in the above-identified patent and that said Letters Patent is hereby corrected as shown below:

<u>Column 9,</u>
Line 38, "proaressively switching" should read as -- progressively switching --.

Signed and Sealed this

First Day of February, 2005

JON W. DUDAS
*Director of the United States Patent and Trademark Office*